(12) United States Patent
Holmes et al.

(10) Patent No.: US 7,256,114 B2
(45) Date of Patent: Aug. 14, 2007

(54) PROCESS FOR OXIDE CAP FORMATION IN SEMICONDUCTOR MANUFACTURING

(75) Inventors: Steven J. Holmes, Guilderland, NY (US); Toshiharu Furukawa, Essex Junction, VT (US); Mark C. Hakey, Fairfax, VT (US); David V. Horak, Essex Junction, VT (US); Charles W. Koburger, III, Delmar, NY (US); Larry A. Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 10/905,881

(22) Filed: Jan. 25, 2005

(65) Prior Publication Data

US 2006/0166432 A1    Jul. 27, 2006

(51) Int. Cl.
*H01L 21/00* (2006.01)
(52) U.S. Cl. ................ 438/595; 438/770; 257/E21.176

(58) Field of Classification Search ................ 438/301, 438/303, 305, 761, 763, 585–595, 770; 257/E21.176
See application file for complete search history.

(56) References Cited

U.S. PATENT DOCUMENTS 5,232,781 A    8/1993   Takemura et al.
6,995,065 B2*  2/2006   Chou et al. ................. 438/303

* cited by examiner

*Primary Examiner*—Richard A. Booth
(74) *Attorney, Agent, or Firm*—Yuanmin Cai (57) ABSTRACT

A process for forming a semiconductor device having an oxide beanie structure (an oxide cap overhanging an underlying portion of the device). An oxide layer is first provided covering that portion, with the layer having a top surface and a side surface. The top and side surfaces are then exposed to an oxide deposition bath, thereby causing deposition of oxide on those surfaces. Deposition of oxide on the top surface causes growth of the cap layer in a vertical direction and deposition of oxide on the side surface causes growth of the cap layer in a horizontal direction, thereby forming the beanie structure.

14 Claims, 10 Drawing Sheets

PROCESS FOR OXIDE CAP FORMATION IN SEMICONDUCTOR MANUFACTURING

FIELD OF THE INVENTION

This invention relates to semiconductor device manufacturing, and in particular to formation of oxide cap structures (known in the art as "beanie" structures) using a process having a minimal number of steps.

BACKGROUND OF THE INVENTION

Figure 1A:
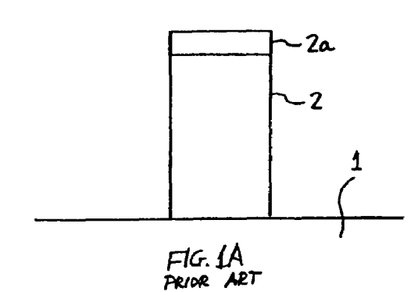
FIGS. 1A-1E illustrate steps in a conventional process for forming a beanie structure on an FET gate.
Figure 1B:
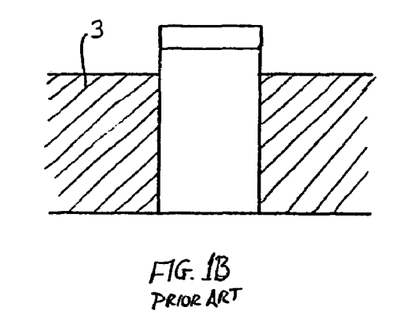
Figure 1C:
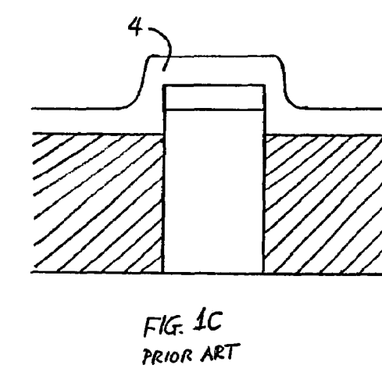
Figure 1D:
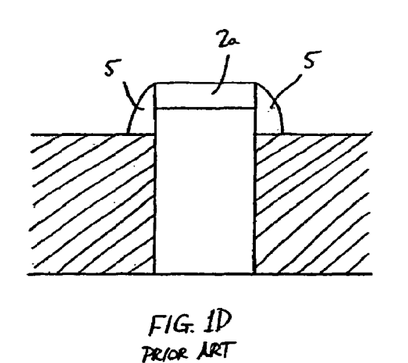
Figure 1E:
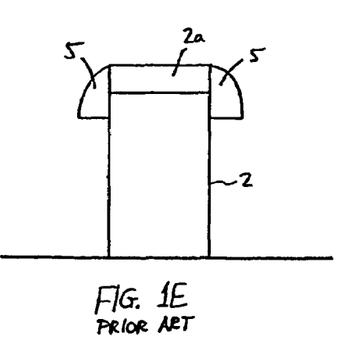

In the manufacturing of semiconductor devices, particularly DRAM devices having FETs, the need for ever-increasing density of electrical contacts makes it desirable to fabricate borderless contact structures. The use of cap structures which overhang the sides of the capped region (beanie structures) facilitates processing of borderless contacts. However, the conventional method for forming a beanie structure involves several film deposition and etching steps. Steps in a typical process are shown in FIGS. 1A-1E. The structure to be capped (e.g. an FET gate structure 2 on a substrate 1, as in FIG. 1A) has an oxide cap layer 2a formed at the top of the structure. A layer 3 of sacrificial material is deposited on the substrate, and then planarized and etched so that its top surface is below layer 2a (FIG. 1B). A conformal layer 4 (typically silicon oxide) is deposited on the sacrificial material and over the gate structure (FIG. 1C). This layer is then etched to form structures 5, resembling spacers used in conventional FET processing, on the upper sidewalls of the gate (FIG. 1D). The sacrificial layer 3 is then removed, leaving a beanie structure, comprising structures 5 and cap layer 2a, on the gate structure 2 (FIG. 1E). This process, which requires film deposition, planarization and etching, is cumbersome and costly.

Accordingly, there is a need for a process for fabricating a beanie structure with a reduced number of steps, so that the advantages of using beanie structures may be realized in a manufacturing environment.

SUMMARY OF THE INVENTION

The present invention provides a process for forming a semiconductor device having an oxide beanie structure (that is, an oxide cap covering and overhanging an underlying portion of the device). In accordance with the present invention, this is done by providing an oxide layer (a first layer, typically silicon dioxide) covering that portion, with the layer having a top surface and a side surface, and then depositing an oxide material (typically silicon dioxide) selectively on the top surface and the side surface of the first layer by liquid oxide deposition. The liquid oxide deposition is preferably done by exposing the first layer to an oxide deposition bath having a supersaturated aqueous solution of silica with hydrofluoric acid.

Deposition of oxide on the top surface causes growth of the cap layer in a vertical direction and deposition of oxide on the side surface causes growth of the cap layer in a horizontal direction, thereby forming the beanie structure. The liquid oxide deposition may be performed at a temperature less than about 35° C. The completed beanie structure extends vertically and horizontally from the first layer a distance about 5 nm to about 100 nm. It is noteworthy that the beanie structure is formed in a single step (the liquid deposition on the first oxide layer).

BRIEF DESCRIPTION OF THE DRAWINGS

FIGS. 2A, 2B-1, 2C-1 and 2D-2F schematically illustrate steps in a process for forming a beanie structure on an FET gate during front-end-of-the-line (FEOL) processing, in accordance with a first embodiment of the invention.

FIGS. 2B-2 and 2C-2 illustrate an alternate process for forming a beanie structure during FEOL processing.

FIGS. 2B-3 and 2C-3 illustrate another alternate process for forming a beanie structure during FEOL processing.

FIGS. 3A, 3B, 3C-1, 3D1, 3E and 3F schematically illustrate steps in a process for forming a beanie structure on regions embedded in a dielectric during back-end-of-the-line (BEOL) processing, in accordance with a further embodiment of the invention. further embodiment of the invention.

FIGS. 3C-2 and 3D-2 illustrate an alternate process for forming a beanie structure during BEOL processing.

DETAILED DESCRIPTION OF PREFERRED EMBODIMENTS

In preferred embodiments of the invention, beanie structures of oxide are formed in a single deposition step (a liquid oxide deposition step), in which silicon oxide is deposited from a supersaturated aqueous solution of silica with hydrofluoric acid onto previously formed oxide cap structures. This oxide deposition selectively forms an oxide layer on oxide surfaces. Accordingly, a beanie structure may easily be obtained by liquid oxide deposition on an appropriately shaped oxide cap. This process may be employed in both FEOL and BEOL situations, as detailed below.

First Embodiment

FEOL Process

Figure 2A:
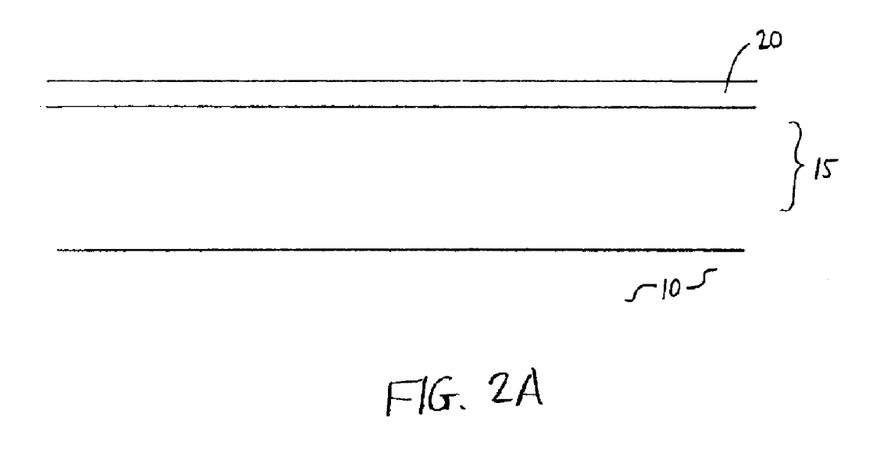
Figure 2B:
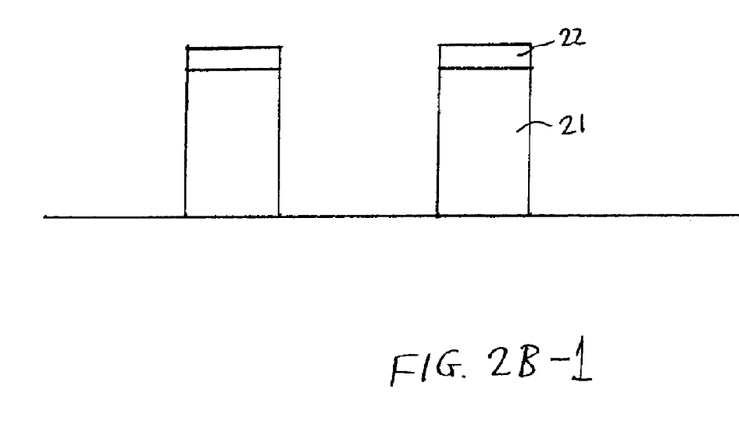

In this embodiment, a beanie structure is formed on a gate stack during FEOL processing. A substrate 10 has a gate oxide, a gate conductor, and possibly other films deposited thereon, to form a gate stack 15. A silicon oxide cap layer 20 is deposited on top of the gate stack, as shown in FIG. 2A. Individual gate structures 21 are then formed by lithographic patterning and etching, using techniques known in the art. The gate structures each have an oxide cap 22, as shown in FIG. 2B-1.

Figure 2B:
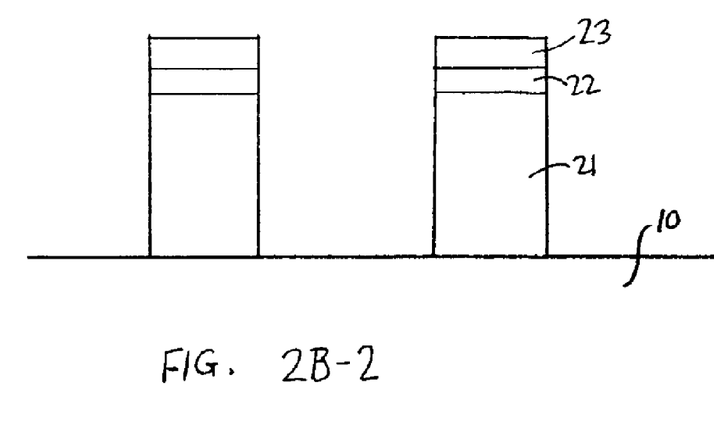
Figure 2B:
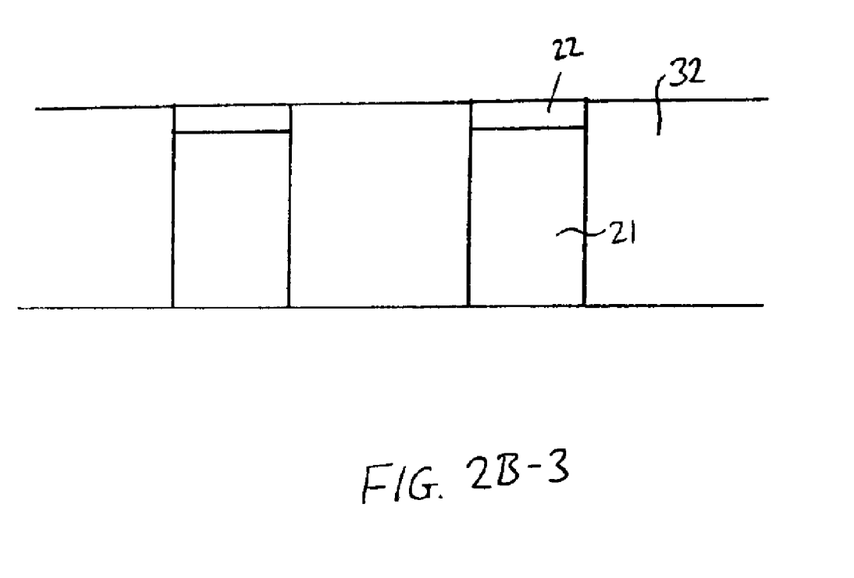
Figure 2C:
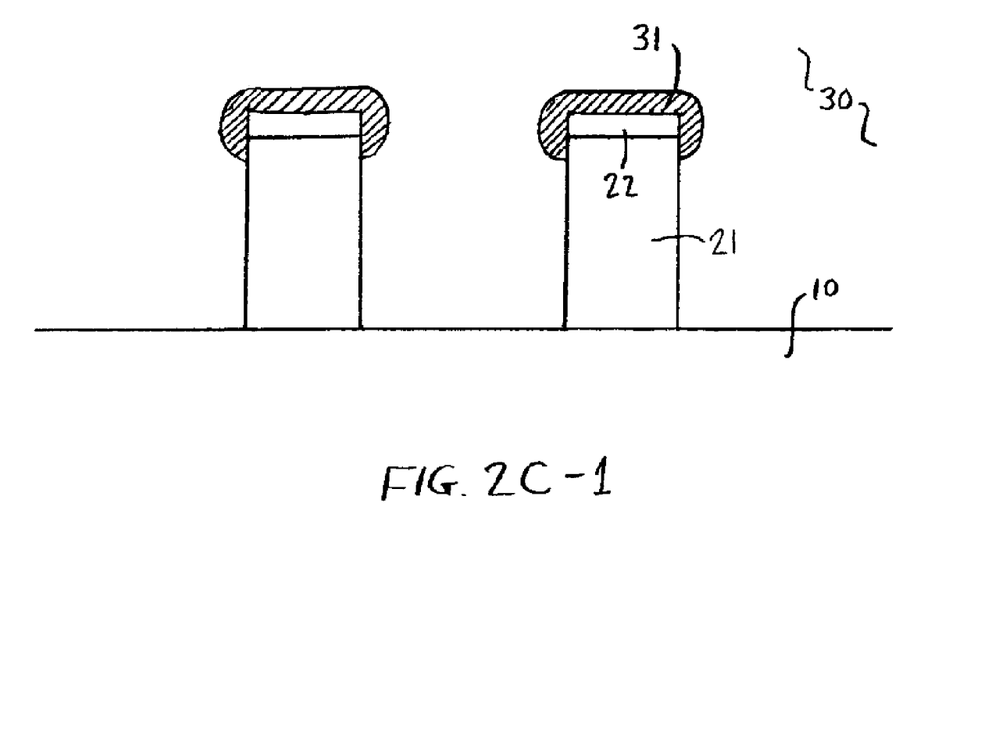

The substrate 10 is then placed in a deposition bath 30 for the liquid deposition of silicon oxide. U.S. Pat. No. 5,232,781 (Takemura et al.) describes a type of deposition bath used in this embodiment, namely a supersaturated aqueous solution of silica with hydrofluoric acid. As is understood by those skilled in the art, boric acid is added to the hydrofluoric acid as a scavenger, to induce the supersaturation of the solution with silicon oxide. This process proceeds at approximately room temperature (25° C. to 35° C.). Another significant advantage of this process is that the oxide deposition occurs selectively on oxide surfaces exposed to the bath. Since oxide cap 22 has horizontal and vertical surfaces, the oxide growth is in both the vertical and horizontal directions. This results in formation of an additional oxide cap or beanie 31, above and on the sides of oxide cap 22 (FIG. 2C-1). The beanie structure extends vertically and horizontally from oxide cap 22 a distance of about 5 nm to about 100 nm.

Figure 2C:
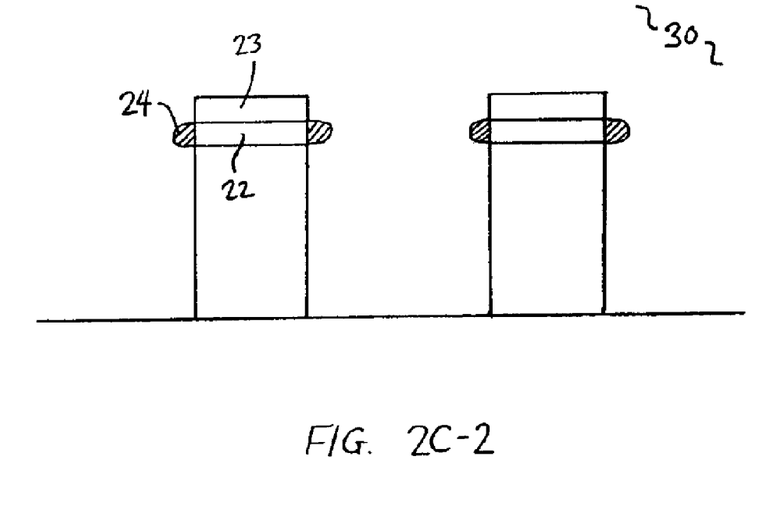

Alternatively, the growth of oxide in the deposition bath may limited to the horizontal direction. This is done by preparing the gate structure 21 with a nitride cap layer 23, in addition to an oxide cap layer 22 (FIG. 2B-2). When this structure is exposed to the oxide deposition bath 30, oxide growth will occur only on the exposed oxide surfaces, namely the vertical surfaces on the sidewalls of layer 22 (FIG. 2C-2). The additional oxide 24 formed in the bath extends horizontally from oxide cap 22 a distance of about 5 nm to about 100 nm. In this instance the combination of oxide cap 22, nitride cap 23 and oxide 24 may be understood as the beanie structure.

Figure 2C:
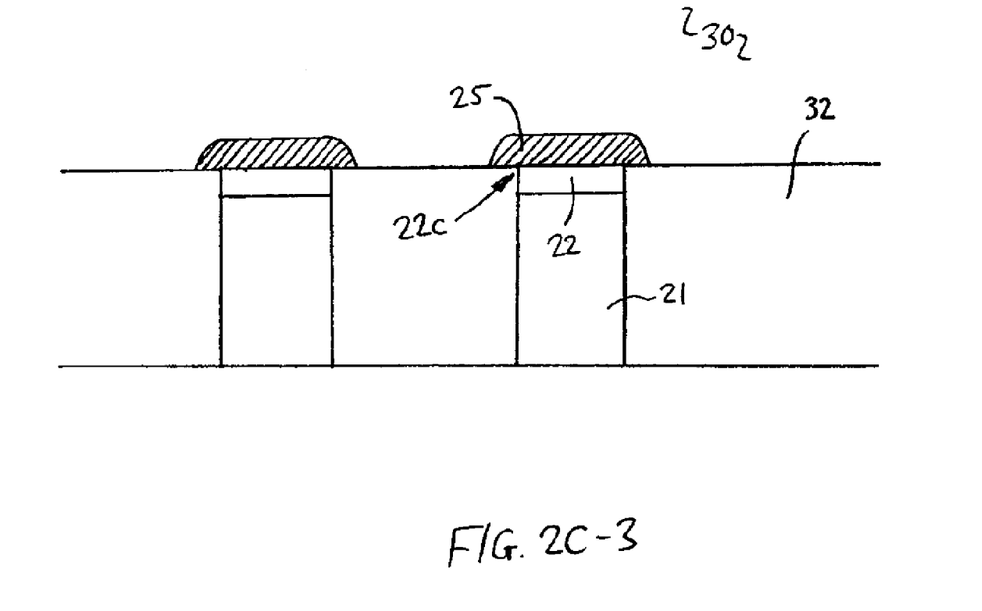
Figure 2D:
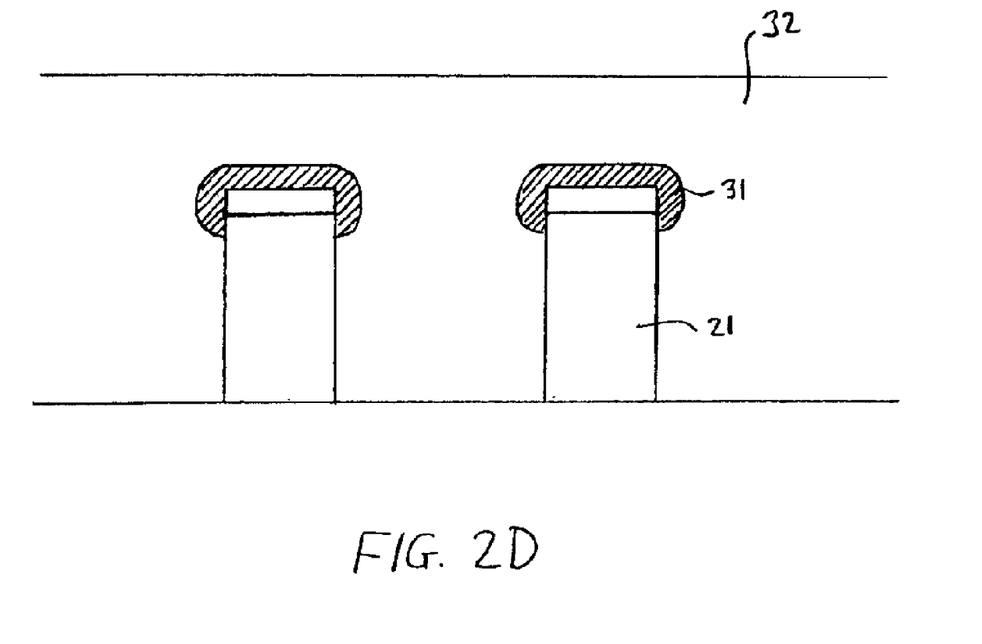

The substrate is then removed from the oxide deposition bath, and a dielectric layer 32 is formed which overlies the substrate and the gate structures (FIG. 2D).

In another alternate process, dielectric material 32 is deposited over the structure of FIG. 2B-1 before exposure to the oxide deposition bath. The dielectric 32 is planarized so that only top surfaces of oxide cap layers 22 are exposed (FIG. 2B-3). In this case the dielectric material should be chosen so that oxide will not be deposited on the surface of the dielectric. When the structure of FIG. 2B-3 is exposed to the oxide deposition bath 30, oxide growth occurs vertically from the top surface of cap 22, and also occurs laterally from the corner 22c of cap 22. The resulting beanie structure 25 is on top of the cap layer 22 and overhangs the structure 21, but is not present on the vertical surface of layer 22 (FIG. 2C-3).

Figure 2E:
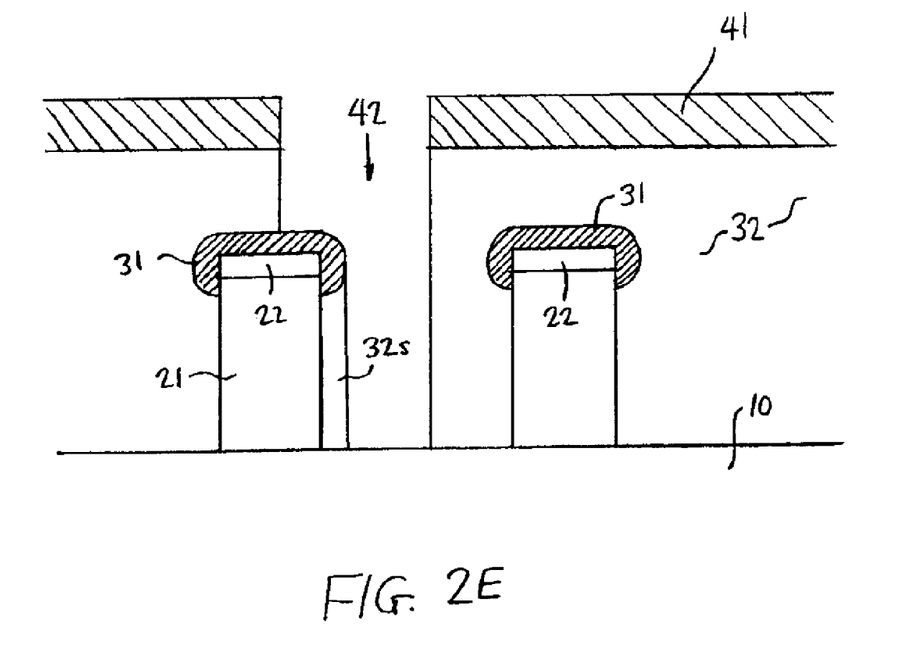

Referring now to FIG. 2E, the gate contact structures will be formed in the layer of dielectric material 32. The dielectric material may be SiLK, aerogel oxide or the like. The dielectric material should be etchable in an etch process which is selective with respect to the beanie oxide material, in order to create a borderless contact. Alternatively, an etch stop layer could be formed on top of the beanie structure, so that conventional silicon oxide could be used as the dielectric material.

The dielectric layer is then patterned using a resist layer 41, and source/drain contact openings 42 are etched in the dielectric (FIG. 2E), using an etch process that removes the dielectric material selectively with respect to the oxide of the beanie 31 (alternatively, beanie 25). As shown in FIG. 2E, this ensures that the source/drain contact is separated from the gate structure 21 by either the beanie structure or a layer 32s of dielectric material on the sidewall of gate structure 21. The thickness (lateral dimension) of layer 32s is determined by the extent of overhang of the beanie structure over the gate structure 21. It will be appreciated that the beanie structure permits opening 42 to extend laterally over gate structure 21, so that a borderless contact may be formed.

Figure 2F:
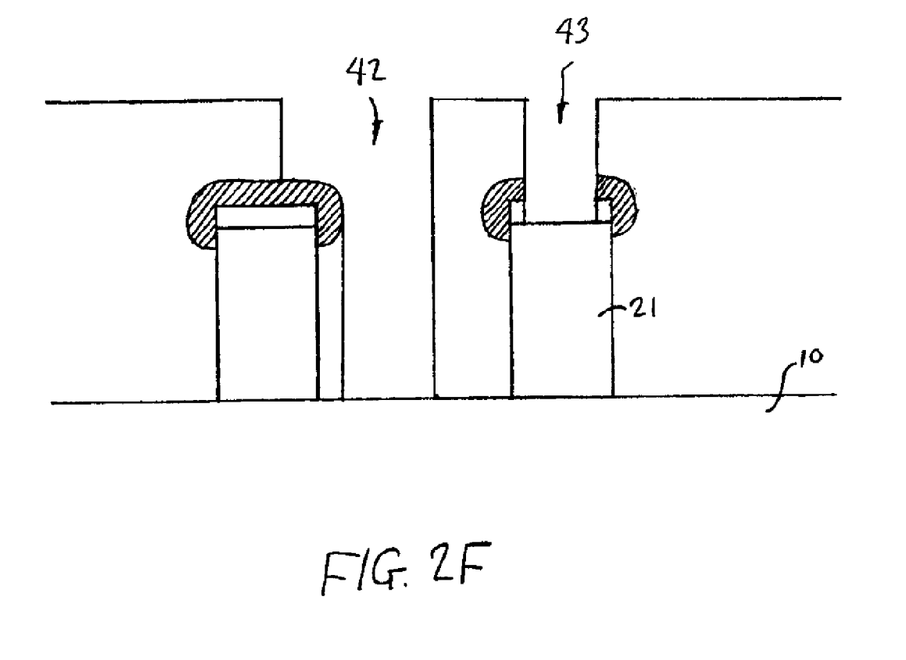

Resist layer 41 is then removed and the dielectric layer is again patterned to form the gate contacts. The gate contact openings 43 are formed by using another etch process (or a combination of etch processes) that removes the dielectric material overlying the gate structure, and etches through the beanie oxide and the oxide of the cap 22. The resulting structure is shown in FIG. 2F. Contact opening 43 is said to be a fully landed contact on gate structure 21. It is also possible to build a partially landed contact to the gate, in which the bottom of opening 43 is partly on the top of structure 21, and partly in dielectric 32. In this case the etch process must be controlled so that opening 43 does not reach substrate 10.

It will be appreciated that, provided the etch process for dielectric layer 32 is selective with respect to the nitride in layer 23 and the oxide in structure 24, the same results may be obtained using the beanie structures of FIG. 2C-2.

The contacts are then metallized by depositing metal in openings 42 and 43. Processing then continues using techniques known in the art.

It is noteworthy that, after the oxide caps 22 are formed on the gate structures, the beanie structures are formed in a single process step. This permits the advantages of beanie structures to be realized at considerably lower cost than with conventional processes.

Second Embodiment

BEOL Process

Figure 3A:
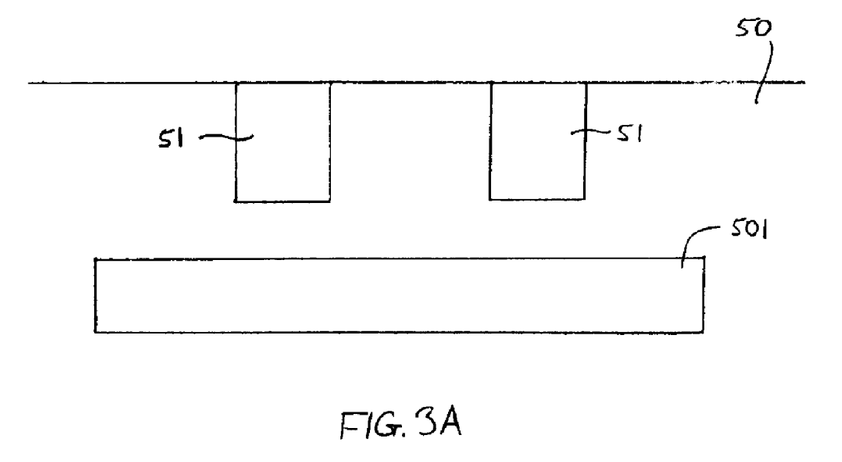

Beanie structures may also be formed in a single deposition process and used to advantage at the back end of the line (BEOL). One typical BEOL arrangement is shown in FIG. 3A, where two metal lines 51 are embedded in an interlayer dielectric 50 (the top surfaces of the metal lines and dielectric layer being coplanar), while another metallized region 501 is encased in the dielectric. It is often desired to form contacts to both regions 51 and 501.

Figure 3B:
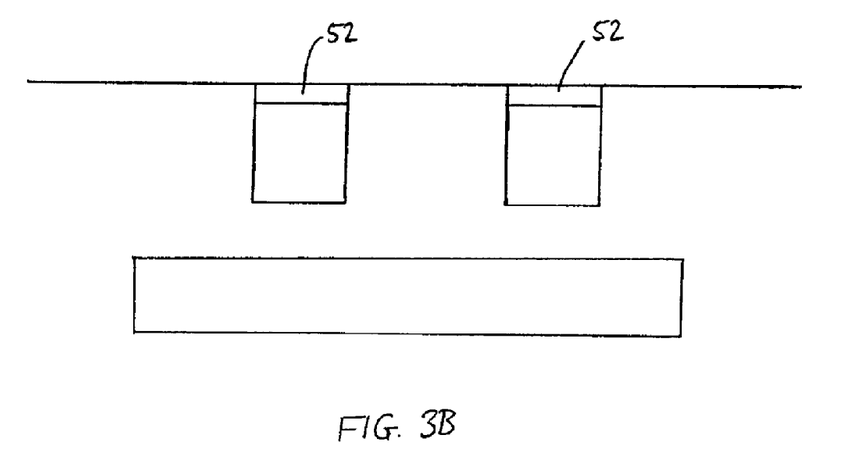
Figure 3C:
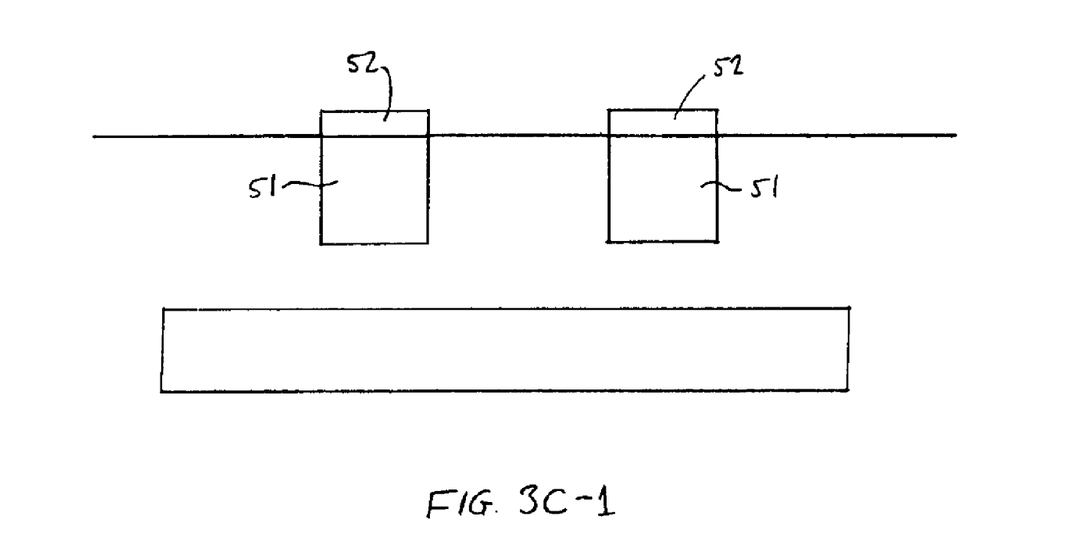

In this embodiment, silicon dioxide caps 52 are first formed at the tops of regions 51, as shown in FIG. 3B. This may be done (for example) by etching or polishing regions 51 to form a shallow recess therein, depositing a blanket layer of oxide, and subsequently polishing away the blanket layer so that only oxide 52 in the recesses remains. At this point, the top surface of oxide 52 is coplanar with the top surface of dielectric 50. The surface of layer 50 is then etched or polished, so that oxide caps 52 protrude from the surface (FIG. 3C-1).

As in the first embodiment, the entire structure is then placed in deposition bath 30 for the liquid deposition of silicon oxide. As shown in FIG. 3D-1 (compare FIG. 2C-1), oxide then grows on oxide surfaces exposed to the bath; the oxide growth is in both the vertical and horizontal directions. This results in formation of an additional oxide cap or beanie 61, above and on the sides of oxide cap 52. Alternatively, the structure of FIG. 3B may be left unchanged until after the liquid deposition of oxide. In that instance, an oxide cap or beanie structure will be formed similar to that shown in FIG. 2C-3.

Figure 3C:
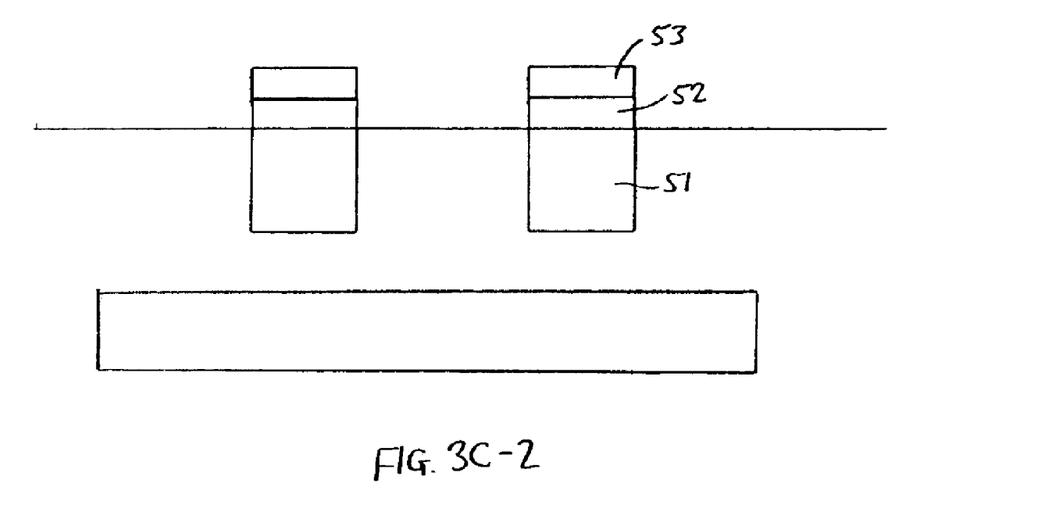
Figure 3D:
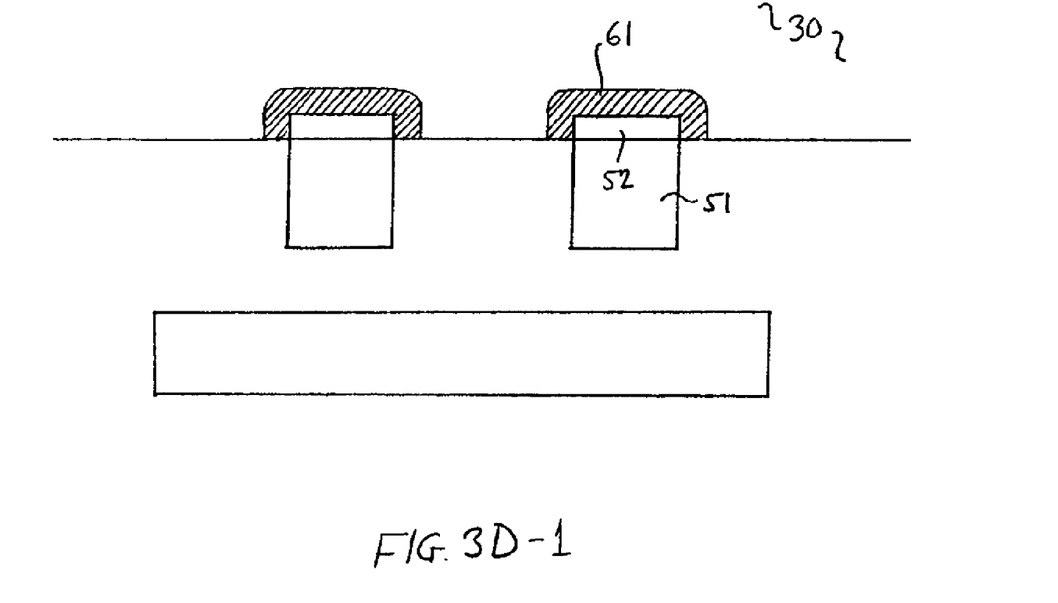
Figure 3D:
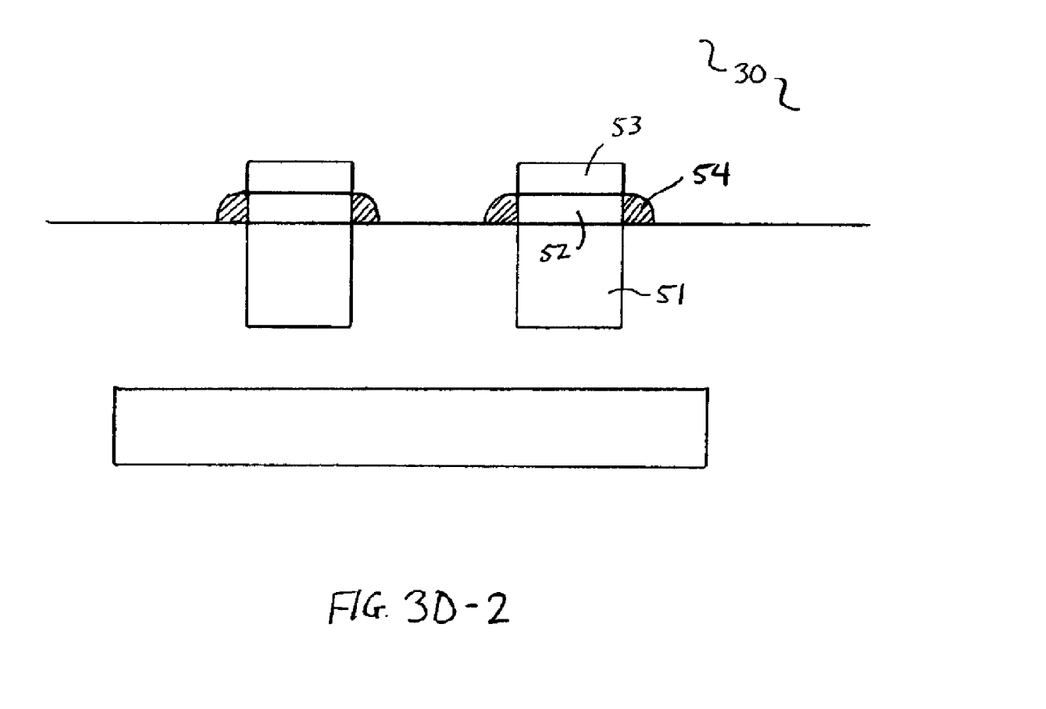

In another alternative, a nitride cap layer 53 may be formed on top of oxide cap 52 (FIG. 3C-2). When this structure is exposed to deposition bath 30, oxide 54 grows only horizontally from the vertical surface of cap 52 (FIG. 3D-2). In this instance, a combination of oxide cap 52, nitride cap 53 and oxide 54 may be understood as the beanie structure, similar to the first embodiment.

Figure 3E:
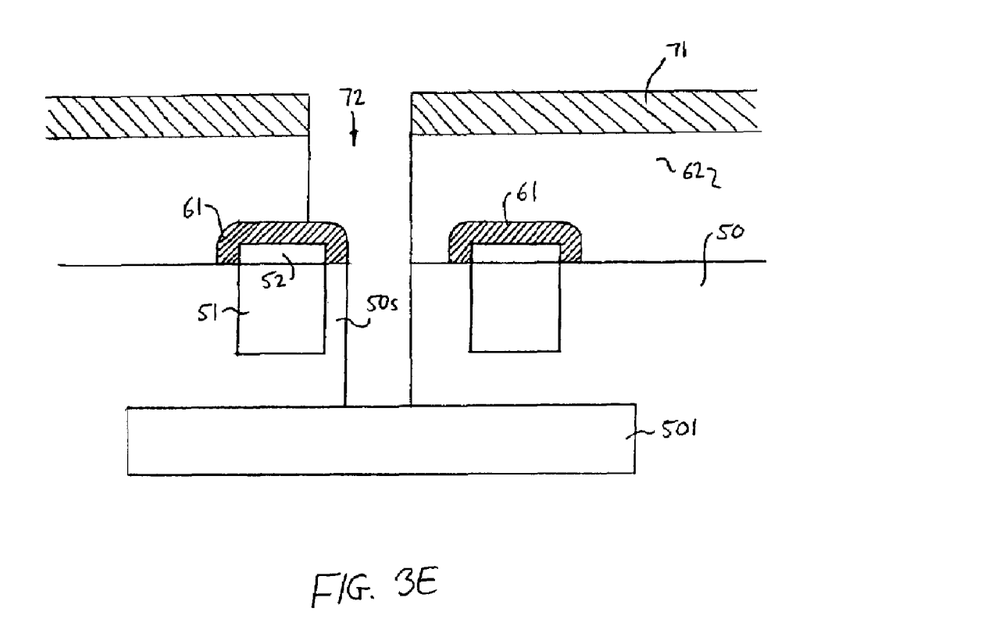
Figure 3F:
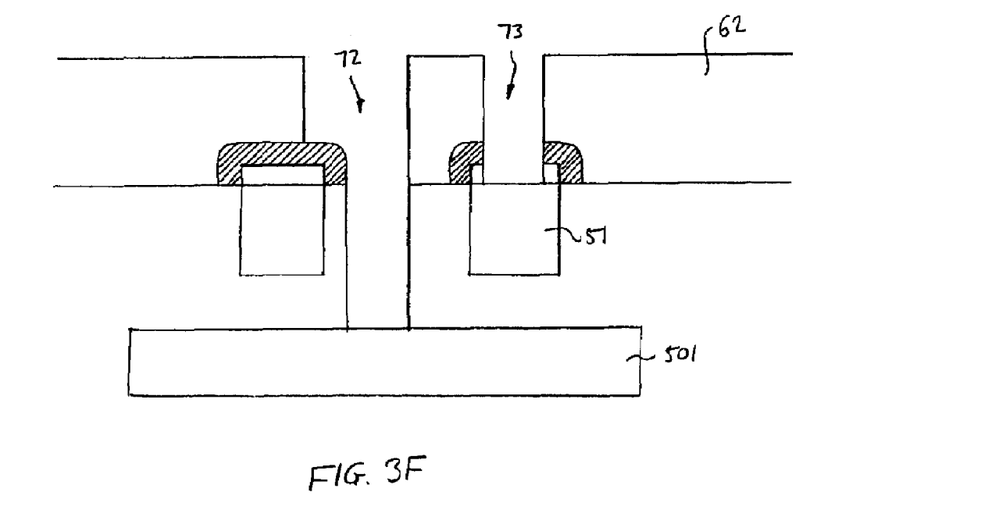

The beanie structures may then be used in forming openings for borderless contacts, as in the first embodiment. An additional dielectric layer 62 is formed which overlies layer 52 and the beanie structures (FIG. 3E). The dielectric material of layers 50 and 62 (SiLK, aerogel oxide or the like) should be etchable in an etch process which is selective with respect to the beanie oxide material. The dielectric layer 62 is then patterned using a resist layer 71, and a contact opening 72 to buried region 501 is etched in the dielectric, using an etch process that removes the dielectric material selectively with respect to the oxide of the beanie structures 61 (alternatively, oxide 54). As shown in FIG. 3E, this ensures that the contact to region 501 is isolated from region 51 by both the beanie structure and a layer 50s of dielectric material adjacent to region 51. Resist layer 71 is then removed and the dielectric layer 62 is again patterned to define the contact openings to regions 51. These contact openings 73 are formed by using another etch process (or a combination of etch processes) that removes the dielectric 62, and etches through the beanie oxide and the oxide of the cap 52. The resulting structure is shown in FIG. 3F. As in the first embodiment, it will be appreciated that the overhang of the beanie structure permits a borderless contact to be formed.

The contacts are then formed by depositing metal in openings 72 and 73. Processing may then continue, using techniques known in the art.

While the present invention has been described in conjunction with specific preferred embodiments, it would be apparent to those skilled in the art that many alternatives, modifications and variations can be made without departing from the scope and spirit of the invention. Accordingly, the invention is intended to encompass all such alternatives, modifications and variations which fall within the scope and spirit of the invention and the following claims.

What is claimed is:

1. A method for forming a semiconductor device including a cap layer overhanging a portion of the device, said cap layer being characterized as a beanie structure, the method comprising the steps of:
   providing a first layer of a first oxide material covering said portion, the first layer having a top surface and a side surface;
   exposing at least one of the top surface and the side surface of the first layer to an oxide deposition bath, thereby causing deposition of a second oxide material on said surface;
   covering at least the beanie structure with a dielectric material; and
   etching the dielectric material with an etch process selective with respect to the beanie structure, to form a contact opening in the dielectric material extending laterally over at least a portion of the beanie structure,
   wherein deposition of the second oxide material on an exposed top surface of the first layer causes growth of the cap layer in a vertical direction and deposition of the second oxide material on an exposed side surface of the first layer causes growth of the cap layer in a horizontal direction, thereby forming the beanie structure, and
   wherein said etching exposes a portion of the beanie structure, and the contact opening is separated from said portion of the device by a layer of said dielectric material adjacent a sidewall of the portion of the device, said layer of dielectric material having a lateral dimension in accordance with a horizontal extent of the beanie structure.

2. A method according to claim 1, wherein the deposition bath comprises a supersaturated aqueous solution of silica with hydrofluoric acid.

3. A method according to claim 1, wherein said exposing step is performed at a temperature less than about 35° C.

4. A method according to claim 1, wherein after said exposing step, the beanie structure extends vertically and horizontally from the first layer a distance of about 5 nm to about 100 nm.

5. A method according to claim 1, wherein the dielectric material is a low-k dielectric.

6. A method according to claim 1, further comprising the step of providing an electrical conductor in the contact opening to form a borderless contact.

7. A method according to claim 1, further comprising the steps of:
   etching the dielectric material, the beanie structure and the first layer to form a contact opening having an exposed area of the portion of the device at a bottom of the contact opening.

8. A method according to claim 1, further comprising the step, prior to said exposing step, of providing a second layer overlying said first layer, and wherein in said exposing step, the second oxide material is not deposited on the second layer, so that growth of the cap layer in the vertical direction is prevented.

9. A method according to claim 8, wherein after said exposing step, the beanie structure extends horizontally with respect to said portion of the device a distance of about 5 nm to about 100 nm.

10. A method for forming a semiconductor device including a cap layer overhanging a portion of the device, said cap layer being characterized as a beanie structure, the method comprising the steps of:
    providing a first layer of a first oxide material covering said portion, the first layer having a top surface and a side surface; and
    exposing at least the top surface of the first layer to an oxide deposition bath, thereby causing deposition of a second oxide material on said top surface,
    wherein the top surface of the first layer is coplanar with an adjacent material so that the side surface of the first layer is not exposed, and deposition of the second oxide material on the exposed top surface of the first layer causes growth of the cap layer in a vertical direction and in a horizontal direction over the adjacent material a distance of about 5 nm to about 100 nm, thereby forming the beanie structure.

11. A method for forming a semiconductor device including a cap layer overhanging a portion of the device, said portion of the device covered by a first layer, the method comprising the step of:
    depositing an oxide material on a side surface of the first layer by liquid oxide deposition,
    wherein a top surface of the first layer is covered by a second layer, so that the oxide material is deposited only on the side surface of the first layer causing growth of the cap layer in a horizontal direction.

12. A method according to claim 11, wherein said depositing step further comprises exposing the first layer to a supersaturated aqueous solution of silica with hydrofluoric acid.

13. A method according to claim 12, wherein said exposing step is performed at a temperature less than about 35° C.

14. A method according to claim 11, wherein the cap layer extends horizontally with respect to said portion of the device a distance about 5 nm to about 100 nm.

* * * * *